United States Patent [19]
Okada et al.

[11] 3,887,886
[45] June 3, 1975

[54] BALANCED MODULATOR CIRCUIT

[75] Inventors: Takashi Okada; Takao Tsuchiya, both of Kanagawa-ken, Japan

[73] Assignee: Sony Corporation, Tokyo, Japan

[22] Filed: Dec. 26, 1973

[21] Appl. No.: 428,136

[30] Foreign Application Priority Data

Dec. 29, 1972 Japan .................................. 48-548

[52] U.S. Cl. ................ 332/43 B; 330/30 D; 330/15
[51] Int. Cl. ........................... H03c 1/54; H03f 3/26
[58] Field of Search .................. 332/44, 43 B, 43 R; 330/15, 30 D, 69

[56] References Cited

UNITED STATES PATENTS

| | | | |
|---|---|---|---|
| 3,122,715 | 2/1964 | Buck | 332/43 B X |
| 3,550,040 | 12/1970 | Sinusas | 332/44 |
| 3,614,668 | 10/1971 | Sudoh | 332/43 B X |
| 3,636,478 | 1/1972 | Glock | 330/15 X |

*Primary Examiner*—Alfred L. Brody
*Attorney, Agent, or Firm*—Lewis H. Eslinger; Alvin Sinderbrand

[57] ABSTRACT

A balanced modulator circuit is provided with first and second differential amplifiers having a pair of inputs and a pair of outputs, respectively. A first input signal is supplied to the pair of inputs of the first and second differential amplifiers, respectively, to drive each of the differential amplifiers differentially and a second input signal is coupled to each pair of inputs in the same phase. The signal coupled to one pair of inputs for the first differential amplifier is the reverse phase with respect to the signal coupled to the pair of inputs of the second differential amplifier. As a result, the product signal of the first and second input signals will be obtained from the output terminals, the pair of outputs of the first and second differential amplifiers being connected to each other.

15 Claims, 7 Drawing Figures

BALANCED MODULATOR CIRCUIT

BACKGROUND OF THE INVENTION

1. Field Of The Invention

This invention relates generally to a balanced modulator circuit, and more particularly to a double-balanced modulator suitable for construction as an integrated circuit.

Such a balanced modulator circuit will be applicable to convert or modulate electrical signals of different frequencies so as to obtain a resultant signal of a desired frequency, and to phase-detect by applying two signals having an equal frequency component.

2. The Prior Art

In an conventional double-balanced modulator circuit, a pair of transistorized differential amplifiers is provided, and a first input signal is applied differentially to the bases of each differential amplifier. Each output terminal of a third transistorized differential amplifier is connected to the emitters of one pair of the differential amplifiers, respectively. A second input signal is applied to the bases of the third differential amplifier in such a manner that the emitter currents flowing through the third differential amplifier are modulated by the second input signal. The modulated currents are further modulated by means of the first input signal by flowing through the pair of differential amplifiers. The modulated currents are applied to two load impedance circuits selectively.

In this manner, the two input signals are combined in such a manner that the output signals taken from one of the load impedance circuits consists solely of the product signals.

However, in such a modulator circuit, the input signal source that drives each differential amplifier operates as a signal voltage source, so that thhe circuit has a defect that the voltage range within which the product output signal is linearly related to the input signal is very narrow.

Further, in order that the emitter currents of the pair of differential amplifiers of the prior art can be modulated by the second signal, such circuits have the further disadvantage that the dynamic range and the gain of the output signal are not determined independently.

An object of the present invention is to provide an improved transistorized modulator circuit free from the defects encountered in the prior art.

Another object of the invention is to provide a transistorized modulator circuit which is adaptable to integrated circuit fabrication.

A further object of the invention is to provide a transistorized modulator circuit which has superior linearity.

A still further object of the invention is to provide a new modulator circuit in which the dynamic range and gain of the modulated output signal can be adjusted independently.

Other objects of the present invention will become apparent to those skilled in the art from the disclosures made in the following description of preferred embodiments of the invention as illustrated in the accompanying drawings.

SUMMARY OF THE INVENTION

A circuit made in accordance with this invention has two differential amplifiers, each of which has two transistors and, therefore, two input terminals. A first signal voltage is applied differentially to the two terminals of each differential amplifier. A second signal voltage is applied in the same polarity, or phase to both input terminals of at leasst one of the differential amplifiers and, by differential operation, the second signal voltage is connected to the nput terminals of the second differential amplifier in the opposite polarity, or phase, whereby there is differential operation between the two differential amplifiers as well as differential operation of each differential amplifier, itself.

DESCRIPTION OF THE PREFERRED EMBODIMENTS

Figure 1:
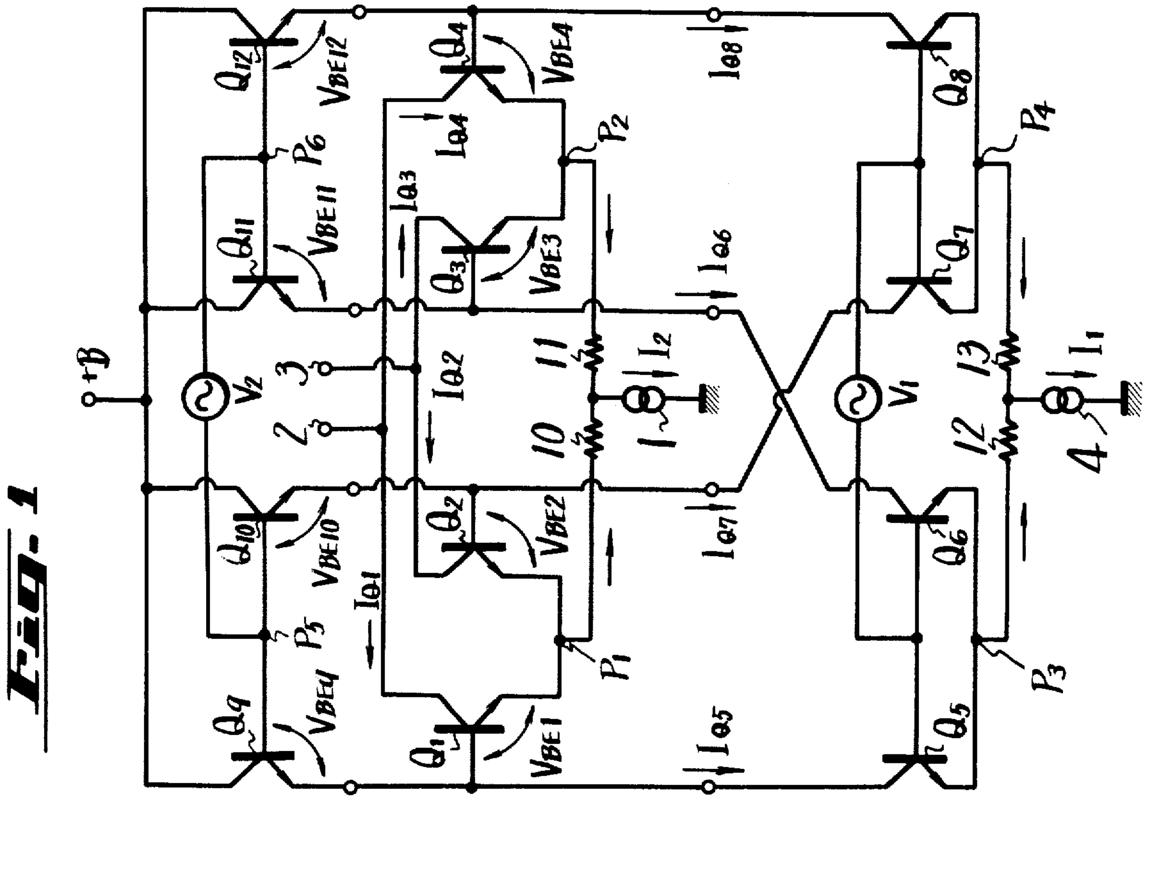
FIG. 1 is a schematic diagram of one embodiment of a balanced modulator circuit according to this invention.

In the embodiment of FIG. 1, a pair of transistors $Q_1$ and $Q_2$ forms a first differential amplifier, and a second pair of transistors $Q_3$ and $Q_4$ forms a second differential amplifier. The emitters of the transistors $Q_1$ and $Q_2$ are connected together at a point $P_1$, and the emitters of the transistors $Q_3$ and $Q_4$ are connected together at a point $P_2$. The connection points $P_1$ and $P_2$ are connected to a common constant current source 1, by resistors 10 and 11, which are used to improve the linearity characteristics of the first and second differential amplifiers. The collectors of transistors $Q_1$ and $Q_4$ of the first and second differential amplifiers are both connected to a first output terminal 2, while the collectors of transistors $Q_2$ and $Q_3$ of the first and second differential amplifiers are both connected to a second output terminal 3. The first and second output terminals 2 and 3 are in general connected to a direct voltage source through respective load impedances (not shown). As will be described later, the product signal, or modulated signal, of two input signals is obtained from at least one of the terminals 2 and 3.

An input circuit for driving the first and second differential amplifiers with a first signal source $V_1$ includes third and fourth differential amplifiers. The first signal source $V_1$ is connected between the bases of the third differ ential amplifier transistors $Q_5$ and $Q_7$, the collectors of which are connected to the bases of the transistors $Q_1$ and $Q_2$, respectively. The source $V_1$ is also connected between the bases of the fourth differential amplifier, which consists of transistors $Q_6$ and $Q_8$. The collectors of the transistors $Q_6$ and $Q_8$ are connected to the bases of the transistors $Q_3$ and $Q_4$, respectively. The emitters of the transistors $Q_5$ and $Q_6$ are connected together at a point $P_3$ and the emitters of transistors $Q_7$ and $Q_8$ are connected together at a point $P_4$. The connection points $P_3$ and $P_4$ are connected to a common constant current source 4 by means of a pair of resistors 12 and 13, which are used for improving the linearity characteristics in the same manner as the resistors 10 and 11. Thus, both of the first and second differential amplifiers are driven differentially by the first signal source $V_1$.

The second signal source $V_2$ is connected to the first and second differential amplifiers through transistors $Q_9$, $Q_{10}$, $Q_{11}$ and $Q_{12}$ which convert the second signal voltage source $V_2$ to a current signal source. That is, the collector-emitter paths of the transistors $Q_9$ and $Q_{10}$ are connected between a direct voltage source +B and the bases of transistors $Q_1$ and $Q_2$, respectively, and the collector- emitter paths of the transistors $Q_{11}$ and $Q_{12}$ are connected between the direct voltage source +B and the bases of the transistors $Q_3$ and $Q_4$, respectively. The bases of the transistors $Q_9$ and $Q_{10}$ are connected together at a point $P_5$, the bases of the transistors $Q_{11}$ and $Q_{12}$ are connected together at a point $P_6$, and the second signal source $V_2$ is connected between the points $P_5$ and $P_6$.

With the circuit thus formed, the second input signals from the source $V_2$ are supplied to the first and second differential amplifiers in opposite phase, and hence these two differential amplifiers comprising the transistors $Q_1$, $Q_2$ and $Q_3$, $Q_4$, respectively, apparently form a single differential amplifier.

A description will now be given of the operation of the balanced modulator circuit according to the invention as embodied in FIG. 1.

It is assumed that a current $I_1$ is flowing through the second constant current source 4 and a current $I_2$ is flowing through the first constant current source 1. The transistors $Q_5$ and $Q_6$ are both affected by the voltage at one terminal of the source $V_1$ and the transistors $Q_7$ and $Q_8$ are both affected by the voltage at the other terminal of the source $V_1$. Thus, if the voltage applied to the bases of the transistors $Q_5$ and $Q_6$ allows a fraction X of the current $I_1$ to flow through their collector-emitter circuits, the remainder of the current $I_1$ must flow through the transistors $Q_7$ and $Q_8$. This remainder current is the difference between the total current $I_1$ and the fraction $XI_1$ that flows through the transistors $Q_5$ and $Q_6$, or $(1-X)I_1$. It is assumed that half of the current $(1-X)I_1$ flows through the collector-emitter circuit of each of the transistors $Q_7$ and $Q_8$. These currents are, respectively:

$$I_{Q5} = I_{Q6} = \frac{X}{2} I_1,$$

and $$I_{Q7} = I_{Q8} = \frac{(1-X)}{2} I_1,$$

The currents $I_{Q1}$, $I_{Q2}$, $I_{Q3}$ and $I_{Q4}$ flowing through the transistors $Q_1$, $Q_2$, $Q_3$, and $Q_4$ of the first and second differential amplifiers are controlled by the currents $I_{Q5}$, $I_{Q6}$, $I_{Q7}$, and $I_{Q8}$ and the second signal source $V_2$ and are expressed as follows:

$I_{Q1} = aYI_2$ $I_{Q2} = (1-a)\ YI_2$ $I_{Q3} = (1-b)\ (1-y)\ I_2$ $I_{Q4} = b(1-Y)\ I_2$ where $Y$ represents the fraction controlled by the second signal source $V_2$, and $a$ and $b$ the fractions controlled in the first and second differential amplifiers by the first signal source $V_1$.

Further, if it is assumed that voltages across the base-emitter electrodes of the transistors $Q_1$, $Q_2$, $Q_3$, $Q_4$, $Q_9$, $Q_{10}$, $Q_{11}$ and $Q_{12}$ are $V_{BE1}$, $V_{BE2}$, $V_{BE3}$, $V_{BE4}$, $V_{BE9}$, $V_{BE10}$, $V_{BE11}$ and $V_{BE12}$, respectively, they are expressed as follows:

$$V_{BE9} = h\left( ln\ \frac{XI_1}{2I_s}\right) \quad (1)$$

$$V_{BE1} = h\left( ln\ \frac{aYI_2}{I_s}\right) \quad (2)$$

$$V_{BE10} = h\left( ln\ \frac{(1-X\ I_1}{z\ I_s}\right) \quad (3)$$

$$V_{BE2} = h\left( ln\ \frac{(1-a)\ YI_2}{I_s}\right) \quad (4)$$

$$V_{BE11} = h\left( ln\ \frac{XI_1}{2I_S}\right) \quad (5)$$

$$V_{BE3} = h\left( ln\ \frac{(1-b)(1-Y)}{I_S} I_2\right) \quad (6)$$

$$V_{BE12} = h\left( ln\ \frac{(1-x)I_1}{2I_S}\right) \quad (7)$$

$$V_{BE4} = h\left( ln\ \frac{b(1-Y)I_2}{I_S}\right) \quad (8)$$

where $h$= KT/q, K is Boltzmann's constant, $T$ is the absolute temperature in degree Kelvin, $q$ is the charge on an electron, and $I_S$ is the saturation current of each transistor.

In this case, the following balanced equations (9) and (10) are satisfied:

$$V_{BE9} + V_{BE1} = V_{BE10} + V_{BE2} \quad (9)$$

$$V_{BE11} + V_{BE3} = V_{BE12} + V_{BE4} \quad (10)$$

Accordingly, if the equations (1) to (4) and (5) to (8) are substituted into the equations (9) and (10), respectively, the resulting equations may be simplified to the following form:

$$aX = (1-X)\ (1-a) \quad (9')$$

$$X(1-b) = (1-X)b \quad (10')$$

Therefore, the following equations (11$a$) and (11$b$) are obtained:

$$a = 1 - X \quad (11a)$$

$$b = X \quad (11b)$$

As a result, the output current $I_{Q1}$ of the transistor $Q_1$ is expressed as $(1-X)YI_2$ and that $I_{Q4}$ of transistor $Q_4$ as $X(1-Y)I_2$, so that the output current $I_{01}$ delivered to the first output terminal 2 becomes the sum of two output currents $I_{Q1}$ and $I_{Q4}$ and hence is expressed by the following equation (12):

$$I_{01} = \{(1-X)Y + X(1-Y)\}\ I_2 \quad (12)$$

While, the output current $I_{Q2}$ of transistor $Q_2$ is expressed as $XYI_2$ and that $I_{Q3}$ of transistor $Q_3$ as $(1-X)(1-Y)I_2$, so that the output current $I_{02}$ delivered to the second output terminal 3 is expressed by the following equation (13) as the sum of output currents $I_{Q2}$ and $I_{Q3}$:

$$I_{02} = \{XY + (1-X)(1-Y)\} \quad I_2 \tag{13}$$

Since the factors $(1-X)$ and $(1-Y)$ can be expressed as $\overline{X}$ and $\overline{Y}$, respectively, the output currents $I_{01}$ and $I_{02}$ can be rewritten as follows:

$$I_{01} = (\overline{X}Y + X\overline{Y})I_2 \tag{14a}$$

$$I_{02} = (XY + \overline{X}\,\overline{Y})\,I_2 \tag{14b}$$

That is to say, the products of input signals which are linearily multiplied with each other are obtained as an output signal.

As described above, in accordance with this invention, the first signal source is connected to the input terminals of the pair of differential amplifiers such that each differential amplifier operates differentially, and the second signal source is connected such that the pair of differential amplifiers forms a single differential amplifier. In this case, the product signal of the signals from the first and second signal sources is obtained from the output terminals of the single differential amplifier. Thus, with the invention shown in FIG. 1 the following advantages are obtained:

1. Since the first and second differential amplifiers are driven equivalently by the signal current sources to which the first and second signal voltage sources are transformed, the output current therefrom is linear over a wide range.

2. Since the inputs and outputs of the first and second differential amplifiers are controlled by the independent constant current sources 1 and 4, or currents $I_2$ and $I_1$, respectively, the gain of the differential amplifier is determined by the ratio of $I_1$ and $I_2$. Accordingly, if the current $I_1$, by way of example, is made variable, the gain of the differential amplifier can be controlled in response to the magnitude of the current $I_1$.

3. Since the current $I_2$ is in direct proportion to the output current $I_{01}$, as is apparent from equation (14), the dynamic range of the differential amplifiers can be controlled if the current $I_2$ is made variable.

4. Further, with no portion where the AC component of the signal must be grounded, few external terminals need be provided, and there is no variation of DC component in the output current, so that the circuit can be coupled to the following stage directly. Therefore, the circuit is suitable for being formed as an integrated circuit (Ic).

5. Since the output is the linear product of the inputs, only a small amount of higher frequency components is mixed with the output to reduce spurious components.

In the embodiment of FIG. 1, the first and second differential amplifiers are driven differentially by the first signal voltage $V_1$, and the second signal voltage $V_2$ is applied to the first and second differential amplifiers with opposite phases but in the same phase at the two inputs of the respective differential amplifiers. However, it will be apparent that the first signal is applied to the first and second differential amplifiers with the same phase and the second signal is applied to the first and second differential amplifiers to drive the same differentially.

Figure 2:
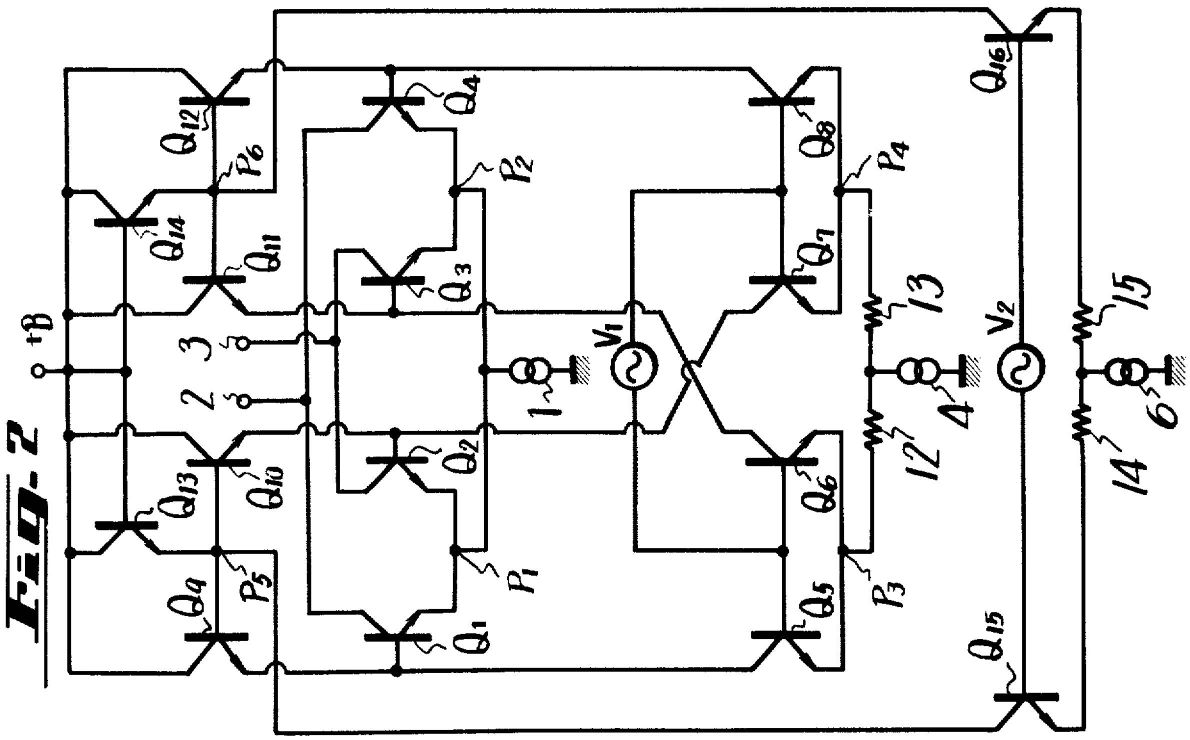
FIGS. 2–6 are, inclusive, schematic diagrams of other embodiments of the balanced modulator circuit according to this invention.

FIG. 2 shows another embodiment of the invention in which the elements corresponding to those in FIG. 1 are identified with the same reference numerals and symbols.

In the embodiment of FIG. 2, a separate input circuit driven by the second signal source $V_2$ is provided. That is, the second signal source $V_2$ is connected between the bases of two additional transistors $Q_{15}$ and $Q_{16}$ that form a further differential amplifier. The collectors of the transistors $Q_{15}$ and $Q_{16}$ are connected to the connection points $P_5$ and $P_6$, respectively, and then to the direct voltage source +B through two diodeconnected transistors $Q_{13}$ and $Q_{14}$, respectively, while the emitters of the transistors $Q_{15}$ and $Q_{16}$ are connected to a third constant current source 6 through resistors 14 and 15, respectively, for linearity compensation.

In the circuit of FIG. 2, the second signal source $V_2$ can control the current value of the constant current source 6 independently, and hence the gain of the differential amplifier, as in the case of the first signal source $V_1$.

The operation and advantages of the circuit shown in FIG. 2 are substantially same as those of the circuit shown in FIG. 1, so that their description will be omitted.

Figure 3:
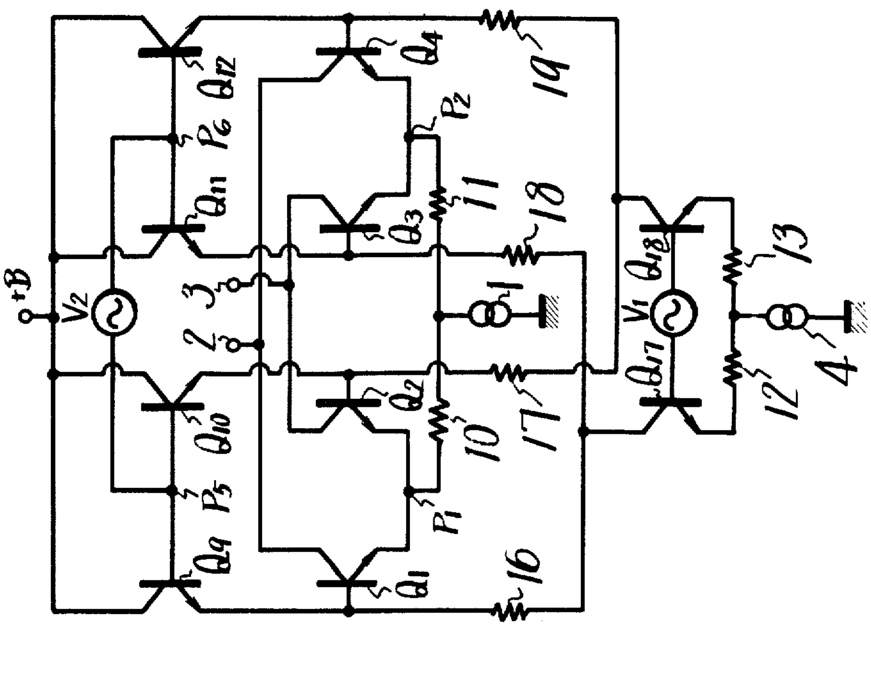

FIG. 3 shows a further embodiment of the invention in which the same reference numerals and symbols as those of FIG. 1 represent the same elements.

In the embodiment of FIG. 3, the first signal source $V_1$ drives a single differential amplifier. That is, the first signal source $V_1$ is inserted between the bases of two transistors $Q_{17}$ and $Q_{18}$ which form a differential amplifier. The collector of the transistor $Q_{17}$ is connected through a resistor 16 to the base of the transistor $Q_1$ and through a resistor 18 to the base of the transistor $Q_3$, while the collector of the transistor $Q_{18}$ is connected through a resistor 17 to the base of transistor $Q_2$ and through a resistor 19 to the base of the transistor $Q_4$.

The operation and advantages of the circuit shown in FIG. 3 are substantially the same as those of FIG. 1, so that their description will be omitted.

Figure 4:
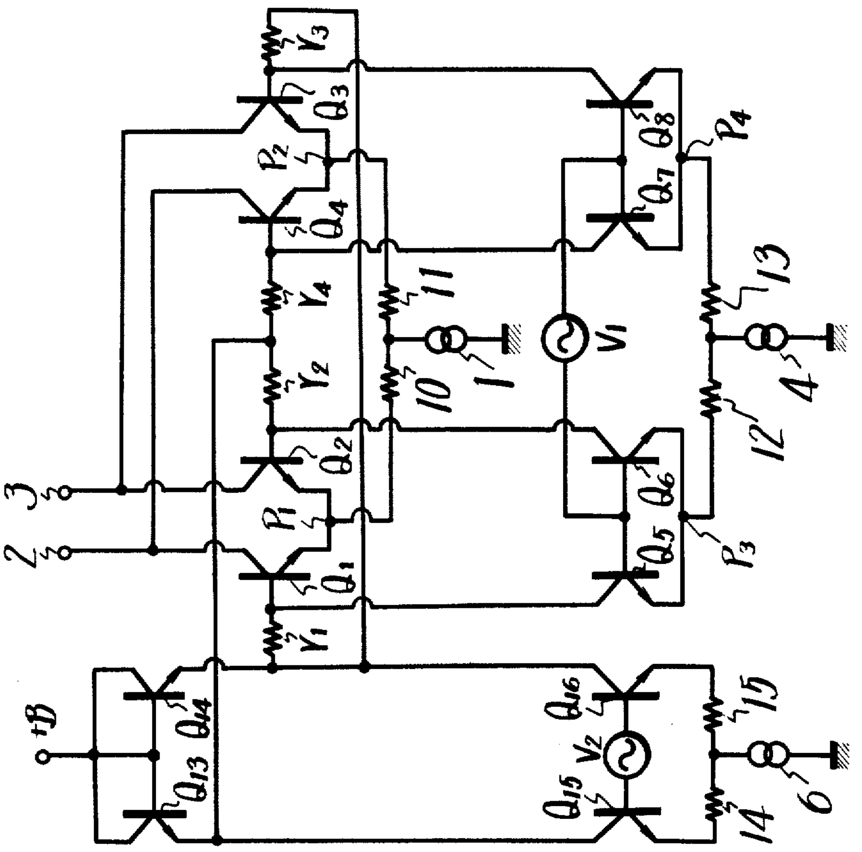

FIG. 4 shows a further embodiment of the invention which is formed by replacing the transistors $Q_9$ to $Q_{12}$ used in the embodiment shown in FIG. 2 with resistors $r_1$ to $r_4$, respectively so as to reduce the size of an IC pellet, or chip, on which the circuit of FIG. 4 is formed.

In the embodiment shown in FIG. 4, however, the second signal source $V_2$ is connected as to operate the first and second differential amplifiers differentially in reverse to the way shown in FIG. 1, and the first signal source $V_1$ is connected differentially to the first and second differential amplifiers but in phase to the pair of transistors of each of the first and second differential amplifiers.

Figure 5:
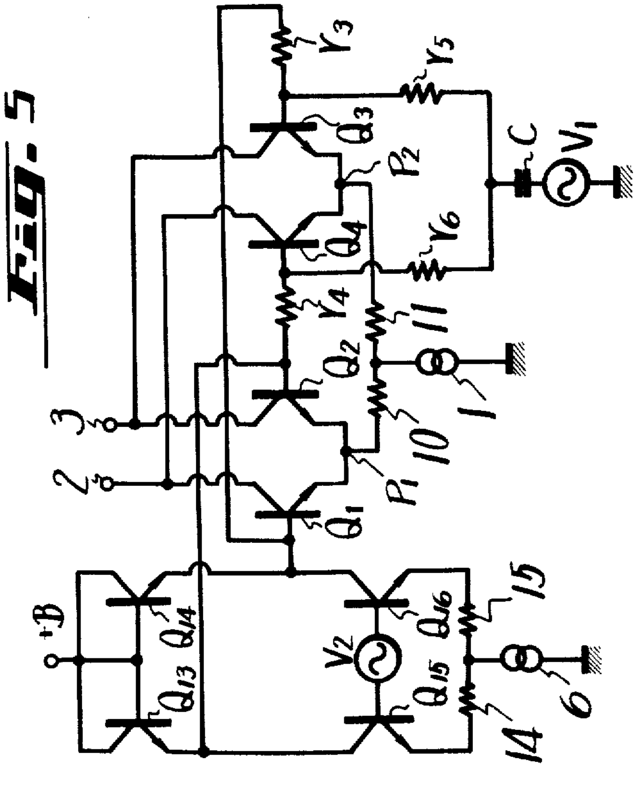

FIG. 5 shows a further embodiment of the invention which is formed by simplifying the circuit shown in FIG. 4.

In the embodiment of FIG. 5, the first signal source $V_1$, is directly connected to the bases of transistors $Q_3$ and $Q_4$ through resistors $r_5$ and $r_6$, respectively, without passing through any differential amplifiers. A capacitor C connected between the first signal source $V_1$ and the connection point between resistors $r_5$ and $r_6$ blocks direct current.

The embodiments of FIGS. 4 and 5 are substantially the same in operation and advantage as the foregoing embodiments and hence no detailed description thereof need be given.

Figure 6:
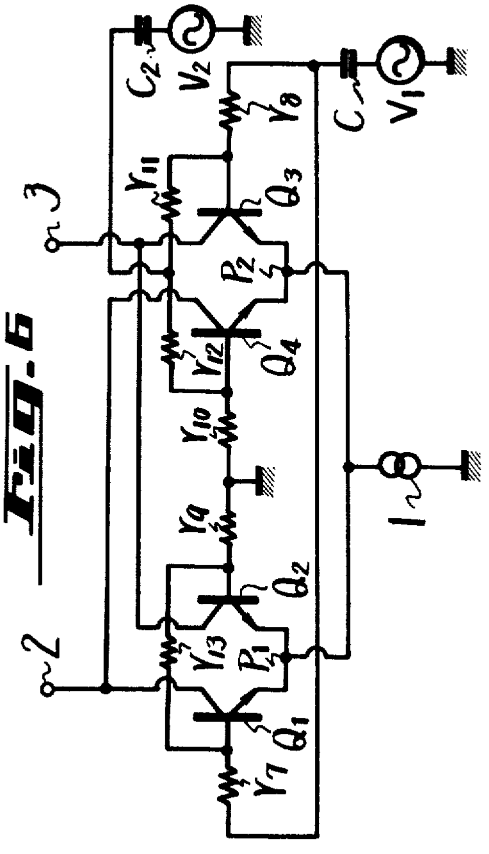

FIG. 6 shows a further embodiment of the invention in which the elements with the same reference numerals and symbols as those of the foregoing embodiments are the same as those of the above embodiments and which is a most simplified one in circuit construction.

In the embodiment of FIG. 6, the first and second signal sources $V_1$ and $V_2$ are connected to drive the first and second differential amplifiers directly. That is, the first signal source $V_1$ is connected through the resistors $r_7$ and $r_8$ to the bases of transistors $Q_1$ and $Q_3$, respectively, and the bases of transistors $Q_2$ and $Q_4$ are grounded through resistors $r_9$ and $r_{10}$, respectively. Thus, the first and second differential amplifiers are each operated differentially by the first signal source $V_1$. The second signal source $V_2$ is connected through a direct current blocking capacitor $C_2$ and resistors $r_{11}$ and $r_{12}$ to the bases of transistors $Q_3$ and $Q_4$, respectively, and the bases of transistors $Q_1$ and $Q_2$ are connected together through a resistor $r_{13}$. The first and second differential amplifiers are both connected to the common constant current source 1. Thus, the pair of differential amplifiers operates as a single differential amplifier.

The operation and effect of the circuit shown in FIG. 6 is also the same as the circuit of FIG. 1.

Figure 7:
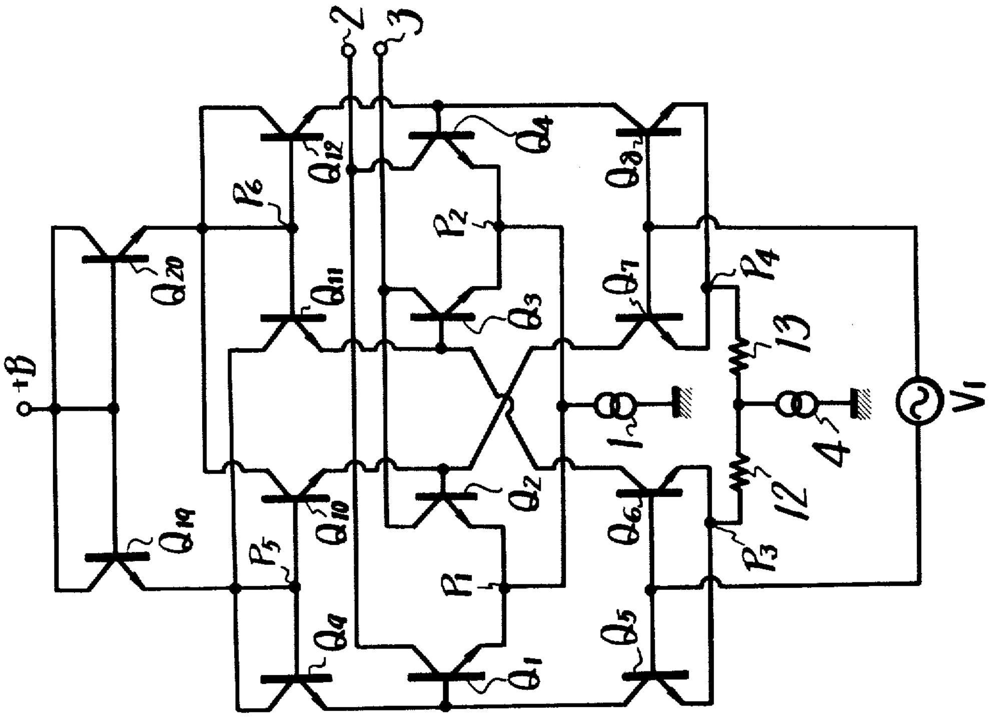
FIG. 7 is a schematic diagram of the circuit according to this invention used as a frequency multiplier.

FIG. 7 shows a still further embodiment of the invention in which the same reference numerals and symbols indicate the same elements.

The circuit shown in FIG. 7, is a frequency multiplier circuit in which the first signal source $V_1$ is the only signal source used. The output signal of the circuit corresponding to the square of the input signal.

In the circuit of FIG. 7, the elements are connected such that, instead of the second signal, the first signal is applied to the respective differential amplifiers in the same phase to the transistors $Q_1$ and $Q_2$, and in opposite phase to the transistors $Q_3$ and $Q_4$. To this end, in the embodiment of FIG. 7 the collectors of transistors $Q_9$ and $Q_{11}$ are connected together and are connected through a diode-connected transistor $Q_{19}$ to the direct voltage source +B, which the collectors of transistors $Q_{10}$ and $Q_{12}$ are connected together and are connected through a diode-connected transistor $Q_{20}$ to the direct voltage source +B.

With the circuit thus constructed, currents $XI_1$ and $(1-X)I_1$, which are equal to those modulated by the first signal and flowing through the resistors 12 and 13, flow through the transistors $Q_{19}$ and $Q_{20}$ and hence voltages corresponding to the currents are produced across the base-emitter circuits of the transistors $Q_{19}$ and $Q_{20}$. The voltage differences thus produced are impressed on the bases of transistors $Q_9$ and $Q_{10}$ and on the bases of transistors $Q_{11}$ and $Q_{12}$, respectively. Thus, the first signal is equivalently applied to the bases of the transistors $Q_9$ and $Q_{10}$ and to the bases of transistors $Q_{11}$ and $Q_{12}$, respectively. As a result, the first and second differential amplifiers are respectively supplied with the first signal differential to each differential amplifier and the first signal in the same phase to each differential amplifier of the input signal. This output signal includes higher frequency components, since the square of a sinusoidal frequency is a function of the second harmonic of that frequency.

What is claimed is:

1. A balanced modulator circuit comprising:

A. a first differential amplifier comprising:
  1. first and second input terminals, and
  2. first and second output terminals;

B. a second differential amplifier comprising:
  1. third and fourth input terminals, and
  2. third and fourth output terminals connected respectively, to said second and first output terminals of said first differential amplifier;

C. means for supplying a first input signal differentially to each of said first and second differential amplifier;

D. means for supplying a second input signal to said first and second input terminals in one condition and for supplying said second input signal to said third and fourth input terminals differentially with respect to said one condition such that said first and second differential amplifier comprise a composite differential amplifier.

2. The balanced modulator circuit of claim 1 in which said first signal supplying means comprises:

A. third and fourth differential amplifiers, each comprising a pair of input terminals and a pair of output terminals, said first input signal being connected differentially to said pair of input terminals of each of said third and fourth differential amplifiers;

B. first connecting means to connect said pair of output terminals of said third differential amplifier to said first and second input terminals of said first differential amplifier; and C. second connecting means to connect said pair of output terminals of said fourth differential amplifier to said third and fourth input terminals of said second differential amplifier.

3. A balanced modulator circuit comprising:

A. a first differential amplifier comprising:
  1. first and second input terminals, and
  2. first and second output terminals;

B. a second differential amplifier comprising:
  1. third and fourth input terminals, and
  2. third and fourth output terminals connected respectively, to said second and first output terminals of said first differential amplifier;

C. means for supplying a first input signal differentially to each of said first and second differential amplifiers;

D. a first pair of buffer amplifiers;

E. a second pair of buffer amplifiers;

F. means for supplying a second input signal to said first and second pairs of buffer amplifiers differentially with respect to each other;

G. means connecting the output terminals of both of said amplifiers of said first pair of buffer amplifiers to said first and second input terminals to supply said second input signal thereto in the same phase; and H. means connecting the output terminals of both of said amplifiers of said second pair of buffer amplifiers to said third and fourth input terminals to supply said second input signal thereto in the opposite phase with respect to the second input signal supplied to said first and second input terminals.

4. The balanced modulator circuit of claim 3 in which each of said pairs of buffer amplifiers comprises a diode-connected transistor.

5. The balanced modulator circuit of claim 1, comprising, in addition, constant current means connected in common to said first and second differential amplifiers.

6. A balanced modulator circuit comprising:

A. a first differential amplifier comprising:
 1. first and second input terminals, and
 2. first and second output terminals;

B. a second differential amplifier comprising:
 1. third and fourth input terminals, and
 2. third and fourth output terminals connected respectively, to said second and first output terminals of said first differential amplifier;

C. third and fourth differential amplifiers, each comprising a pair of input terminals and a pair of output terminals;

D. means for supplying a first input signal differentially to said pair of input terminals of each of said third and fourth differential amplifiers;

E. first connecting means to connect said pair of output terminals of said third differential amplifier to said first and second input terminals of said first differential amplifier;

F. second connecting means to connect said pair of output terminals of said fourth differential amplifier to said third and fourth input terminals of said second differential amplifier;

G. means for supplying a second input signal to said first and second input terminals in one condition and for supplying said second input signal to said third and fourth input terminals differentially with respect to said one condition such that said first and second differential amplifier comprise a composite differential amplifier;

H. first constant current means connected in common to said first and second differential amplifiers; and I. second constant current means connected in common to said third and fourth differential amplifiers.

7. The balanced modulator circuit of claim 3, further comprising a fifth differential amplifier driven by said second input signal and comprising a pair of outputs differentially connected to said first and second pairs of buffer amplifiers.

8. A balanced modulator circuit according to claim 1, in which said second input signal supplying means comprises a differential amplifier which is driven by said first input signal, and one of the outputs of said differential amplifier is connected to one input of each of said first and second differential amplifiers, whereas the other of the outputs of said differential amplifier is connected to the other input of each of said first and second differential amplifiers.

9. A balanced modulator circuit according to claim 1, in which said second input signal supplying means comprises another differential amplifier which is driven by said second input signal, the pair of outputs being connected through resistors to said pair of inputs of the first and second differential amplifiers.

10. A balanced modulator circuit according to claim 1, in which said first input signal is supplied through resistors to the pair of inputs of said first and second differential amplifiers directly.

11. A balanced modulator circuit comprising:

A. first and second differential amplifiers, each comprising a pair of input terminals and a pair of output terminals, respectively;

B. resistor means for connecting said pair of input terminals of the first differential amplifier to said pair of input terminals of the second differential amplifier;

C. a first input signal source connected differentially to the pair of input terminals of said first differential amplifier; and D. a second input signal source connected in phase to each input terminal of the pair of input terminals of the second differential amplifier.

12. A balanced modulator circuit according to claim 11, in which said first input signal source is further connected differentially to the pair of input terminals of said second differential amplifier, a further resistor connects said pair of input terminals of the first differential amplifier to each other, and said second input signal source is connected through additional resistor means to both input terminals of said second differential amplifier.

13. A circuit comprising:

A. a first differential amplifier comprising first and second transistors, the emitters of which are connected together;

B. a second differential amplifier comprising third and fourth transistors, the emitters of which are connected together, and the collectors of said third and fourth transistors being connected to the collectors of said second and first transistors, respectively;

C. a constant current source connected to the common-connected emitters of said first and second differential amplifiers;

D. a third differential amplifier comprising fifth and sixth transistors, the collectors thereof being connected to bases of said first and second transistors, respectively;

E. a fourth differential amplifier comprising seventh and eighth transistors, the collectors thereof being connected to bases of said third and fourth transistors respectively;

F. a first input signal source differentially connected to said third and fourth differential amplifiers differentially;

G. a first signal driving circuit comprising ninth and tenth transistors, the bases of which are connected together and the emitters of which are connected to the bases of said first and second transistorsm respectively; and H. a second signal driving circuit comprising eleventh and twelfth transistors, the bases of which are connected together and the emitters of which are connected to the bases of said third and fourth transistors, respectively.

14. The circuit of claim 13 comprising, in addition, a second input signal source differentially connected to said first and second signal driving circuits for operating said first and second signal driving circuits differentially.

15. The circuit of claim 13 in which the collectors of said eleventh and twelfth transistors are connected to the collectors of said ninth and tenth transistors, and are coupled to the common-connected bases of said ninth and tenth, eleventh, and twelfth transistors, said circuit comprising in addition:

A. a source of reference potential; and

B. a pair of diode-connected transistors connecting the collectors of said eleventh and twelfth transistors to said source of reference potential.

* * * * *